United States Patent
Hays (10) Patent No.: US 9,380,776 B2
(45) Date of Patent: Jul. 5, 2016

(54) GAME ALERT SYSTEM

(71) Applicant: Hogman-Outdoors, LLC, Cypress, TX (US)

(72) Inventor: DeWayne L. Hays, Cypress, TX (US)

(73) Assignee: Hogman-Outdoors, LLC, Cypress, TX (US)

(*) Notice: Subject to any disclaimer, the term of this patent is extended or adjusted under 35 U.S.C. 154(b) by 0 days.

(21) Appl. No.: 14/691,476

(22) Filed: Apr. 20, 2015

(65) Prior Publication Data

US 2015/0296768 A1 Oct. 22, 2015

Related U.S. Application Data

(60) Provisional application No. 61/981,522, filed on Apr. 18, 2014.

(51) Int. Cl.
*G08B 23/00* (2006.01)
*A01M 31/00* (2006.01)
*H05K 5/02* (2006.01)

(52) U.S. Cl.
CPC ........... *A01M 31/002* (2013.01); *H05K 5/0204* (2013.01)

(58) Field of Classification Search
CPC .............................. H05K 5/0204; A01M 31/002
USPC ........................................................ 340/573.2
See application file for complete search history.

(56) References Cited

U.S. PATENT DOCUMENTS

| | | | | |
|---|---|---|---|---|
| 5,450,060 A | * | 9/1995 | Parkhurst | G08B 21/02 340/286.11 |
| 8,860,577 B1 | * | 10/2014 | Chumas | A01M 31/004 248/127 |
| 2003/0067385 A1 | * | 4/2003 | Shank | A63H 33/00 340/539.1 |
| 2005/0237208 A1 | * | 10/2005 | Wojcik | A01M 31/002 340/573.2 |
| 2008/0218341 A1 | * | 9/2008 | Royer | G01S 13/56 340/567 |
| 2008/0247160 A1 | * | 10/2008 | Jiang | A47B 97/00 362/227 |
| 2009/0322259 A1 | * | 12/2009 | Glass | A01M 31/00 315/360 |
| 2011/0225867 A1 | * | 9/2011 | Moore | F41G 1/35 42/114 |
| 2012/0313779 A1 | * | 12/2012 | Papaefstathiou | G05D 1/0038 340/540 |
| 2014/0083188 A1 | * | 3/2014 | Helenelund | G01P 13/00 73/493 |
| 2014/0085125 A1 | * | 3/2014 | Ivtsenkov | G01S 3/30 342/45 |

OTHER PUBLICATIONS

Game Alert and Approach Monitor Deer and Bear Hunting Equipment dated Oct. 7, 2015.
Alert Plus dated Oct. 7, 2015.
Game Alert Junior dated Oct. 7, 2015.
Deer Hunting, Black Bear Hunting and Elk Hunting Equipment dated Oct. 7, 2015.

* cited by examiner

*Primary Examiner* — Hai Phan
*Assistant Examiner* — Zhen Y Wu
(74) *Attorney, Agent, or Firm* — Vinson & Elkins LLP (57) ABSTRACT

A game alert system includes a device mountable on a game feeder that detects motion in a target area and automatically sends an electronic signal to a user, or a hunter, in a remote location to notify the hunter of movement in the area, without alerting or startling animals that triggered the device.

26 Claims, 6 Drawing Sheets

GAME ALERT SYSTEM

CROSS-REFERENCE TO RELATED APPLICATIONS

This application claims benefit of priority to U.S. Provisional Application Ser. No. 61/981,522, filed Apr. 18, 2014 which is incorporated herein by reference in its entirety for all purposes.

BACKGROUND

Feral hogs are wild hogs that are descended from domestic pigs that escaped or were released from captivity and have become a very successful invasive species, particularly in the Southern and Southeastern United States. The Texas Parks and Wildlife Department reports that it is estimated that more than 1.5 million feral hogs live in Texas alone at the time of filing of this application. Feral hogs are a destructive nuisance animal that competes with game and domestic livestock for food, destroys and damages crop plants and pasture and can also destroy fencing and other structures.

While many ranchers and land owners attempt to control hog populations through trapping and hunting of hogs, experience has shown that hogs quickly adapt and learn to avoid traps and hunters. While hogs have poor eyesight, they have well developed senses of smell and hearing and are extremely fast movers, making control methods difficult. Experience has also shown that when a hog population is hunted during daylight hours, those hogs quickly become nocturnal feeders, hiding during daylight.

Because of these behavior patterns, many hunters hunt hogs exclusively or primarily at night, most often around electric feeders that periodically throw corn or bait on the ground, or that can be controlled to throw feed on command. Various devices have been developed to aid hunters in night hunting of hogs, many of which are designed to illuminate the area around a feeder so the hogs can be seen at night. Some products that have been tried are motion sensor lights that mount on a feeder and illuminate the ground around a feeder when motion is detected. This arrangement has drawbacks in that the animals are necessarily located between the light and the hunter which makes it difficult to see the hogs, particularly through a rifle scope at night. Another product is marketed under the name "Hoginator" and purports to solve this problem by providing a battery powered motion sensor light that mounts on a pole and points toward the feeder, thus providing better illumination and no "blinding" of the hunter by looking into the light. The Hoginator, however, can fail in a real world hunting environment, since when hogs converge on a feed area they are likely to destroy anything at ground level that comes between them and available feed.

Additionally, field studies of area lighting products have proven that the permanent night lighting of an area over an extended period of time (regardless of color of light) has an adverse effect on the game feeding at the lighted feeder. Deer and larger hogs tend to avoid a lighted area if other feed sources are available. Hog hunting on most ranches is carried out to control the hog population and limit damage caused by the hogs. It is, therefore, counterproductive to a hunting property to employ a control method that negatively impacts conventional deer or exotic game hunts in an affected area.

In summary, there are inherent difficulties in attempting to adequately light a hunting area, thereby allowing a hunter to hunt from conventional hunting locations (existing hunting blinds) at night. The available products simply do not provide adequate light to take effective shots outside of a 30-50 yard range. In most instances, permanent hunting blinds are set in excess of 100+ yards, rendering the feeder lighting products useless. Rifle mounted scopes cannot gather the needed light from an area light in excess of 100 yards away, and the keen sense of smell of feral hogs makes it advantageous to place a hunting blind up to 100 yards from a feeder

SUMMARY

The game alert system of the current disclosure provides solutions to at least some of the drawbacks of the prior art by providing a novel improvement in the field, at least because the disclosed systems do not rely on illumination of the hunting area. The present disclosure provides significant advantages as a device to be used with night vision equipment to hunt hogs or other species at night with no ground illumination in the hunting area, thus having no negative impact on game visiting an area to feed. The devices are also not ground mounted so they are not impacted or destroyed by game movement in a given area.

The disclosure can be described in certain embodiments as a device mountable on a game feeder that detects motion in a 360° target area and automatically sends an electronic signal to a user, or a hunter, in a remote location to notify the hunter of movement in the area, without alerting or startling any animals that triggered the device. The device thus allows a hunter in a remote location such as a hunting blind or stand as far as 100 or more yards distant, to be aware of game in the target area and to see the game with night vision equipment without producing light or sound that would startle the game.

It is a further aspect of the disclosure that the devices and methods can be effective in day light as well and are not restricted to night hunting. Electronic signals effective during night time or daylight can include, but are not limited to an LED indicator on the device or wired to the device, a laser light emitter directed at the hunter's location, either a pulse or steady beam; or a BLUETOOTH® or other wireless or hard wired device connected to the motion detector that, upon receiving an input from the motion detector transmits a signal to a remote device at a hunter's location. The remote device can be a smartphone, audio or video output device, computer tablet or notebook, or other device configured to receive the signal and to provide an auditory or mechanical output to alert a hunter of game near the feeder. The output can be any appropriate audio signal, including but not limited to a beep, ringtone, or other sound, a text, a vibration, a light, or a combination of sound and vibration or sound, light and vibration. It is understood that any such sound is preferably of low enough volume not to startle any game near the feeder or the hunter. As such the device can also include headphones or earbuds. It is a further aspect that, in embodiments that include a laser emitter signal that the laser can be seen by the hunter, or can be aimed at a device that responds with a secondary signal.

While the disclosure is being described in terms of hunting and night hunting of hogs in particular, it is understood that devices described here are not so limited and can also be used for non-lethal activities such as photography, film, or live capture methods, and with respect to any appropriate animal species, including but not limited to wild, feral, agricultural livestock or domesticated animals.

While not being limited to any particular mounting system, in certain embodiments the Game Alert is configured to be affixed to the underside of an existing feeder, and such a system can be powered by a dedicated battery pack attached to the unit itself or by permanent wiring to an existing feeder battery or power source that is also powering the feeder.

During use of certain embodiments, the Game Alert can be mounted on a feeder as described, while a hunter or other user is positioned at a distance from the Game Alert unit. The unit can then be triggered by game or animal movement around the alarmed feeder. Triggering of an inline nighttime LED motion sensor switch can send voltage to a small 12V LED emitter affixed to a clicktight strip light DC plug connector. An LED adapter splice cable is used to connect to a 12V power source. The lighted LED light notifies the hunter to the presence of animals near the feeder. In those instances when a hunter is positioned from 100 to 500 yards from the feeder, a rifle or scope-mounted illuminator can be activated to illuminate the area near the feeder and to identify an animal.

While the current disclosure is being described in terms of a preferred type of sensor, a day or a night time motion sensor, the invention is not limited to a particular sensor. For example, the described devices and systems can be adapted to use any type of sensing device known in the art that alerts a user to the presence of animals in the target area. Such sensors include, but are not limited to passive infrared heat sensors, ultrasonic and microwave sensors, and acoustic wave or vibration sensors.

The Game Alert system thus allows a hunter to sit and wait for game in darkness or low light conditions, or to wait in daylight without having to concentrate or even stay awake for long periods while waiting for animals to approach a feeder. With Game Alert the hunter can simply sit comfortably waiting for Game Alert to trigger, notifying the hunter to ready rifle, illuminate and shoot.

An initial prototype system was constructed with the electronic components contained in a waterproof and varmint-proof containment housing. The prototype was constructed of schedule 40 PVC and included a CORONIS 77 LED strip light in Red and a click tight strip light DC connector plug. It is understood that the containment box and piping can be made of other materials known and used in the art, including but not limited to metals such as aluminum or stainless steel, ceramics, plastics or high density polymeric materials, for example. The use of all such materials is contemplated by the present disclosure.

In certain embodiments the disclosure can be described as a motion-activated, stealth hunting light designed specifically for night hog hunting around feed areas, hog wallows, or trails. The light features a magnetic base for easy installation on the bottom of metal feeders. In a preferred embodiment the alert light is a motion-activated, single-point, red LED that is triggered by the movement of any animal with a total body area larger than 3 square feet. Once activated, the light stays on for a total of 10 seconds before turning off. If motion is still detected after 5 seconds of being deactivated, the LED will re-illuminate. The light intensity is so low, it does not change game behavior, yet it is highly visible to the hunter. Certain embodiments also include a two-position illuminated rocker switch that energizes the hunting light, confirming battery power output and that internal circuitry is activated. During use, microcircuit technology contained in the device senses game activity and energizes the red LED emitter/indicator, notifying the hunter that game is present.

The disclosed systems can also be combined in a kit or package for commercial sale, including a rifle-mountable green light emitting diode (LED) flashlight. Once the sensor has sensed animal movement and illuminated, a hunter can activate the green LED light on the flashlight by pressing a Tactical Pressure Switch, allowing him or her to quickly scan the area for hogs and take aim.

In preferred embodiments the alert device housing can be constructed of metals such as stainless steel or aluminum, or of ceramic or polymeric materials. Certain embodiments are constructed of acrylonitrile butadiene styrene (ABS) u/v weather resistant polymer resin, injection molded from a machined injection tool, and powered by a 9-volt battery.

While the figures are described in terms of a top and a bottom of the device, it is understood that the device can be mounted under a game feeder for example, with the sensor pointed down, or it can be mounted in certain embodiments with the sensor pointed up, as shown in the drawings. The choice of the term "top" or "bottom" is, therefore, arbitrary and merely used for convenience in describing the various embodiments described herein.

DETAILED DESCRIPTION

A preferred embodiment of a game alert device is shown in the several views of FIGS. 1-10. The device as shown includes a two part housing, including an upper housing 9 and lower housing 1. The housing parts can be assembled as shown by a threaded interlock such that the housing can be screwed apart, or it can be closed with a friction fit or adhesive bond. It is also understood that the housing can be provided in a single part, or in three or more parts as appropriate.

The assembled housing as shown is in the shape or configuration of a spheroid, or elongated spheroid and is of a size that is compact enough to be lightweight and unobtrusive, but large enough to contain the internal components. The generally spheroidal shape is adopted at least in part to maximize the smooth shape of the device and to minimize animal damage caused by chewing or scratching on corners or edges of the device. The device can be provided, however, in any other shape or configuration, included, but not limited to a cuboid, cylindrical, rectangular cylindrical, triangular pyramidal, rectangular pyramidal, cone, truncated cone, frustrum, hexahedral, heptahedral, octahedral, nonahedral, decahedral or dodecahedral, for example, or combinations of any of these, or representative of an object, for example. All such variations, including irregular solid figures not named can be used and combination of any of such shapes would fall within the spirit and scope of the appended claims.

The housing is preferably constructed of a durable material that is weather resistant and animal resistant and would include metals such as steel or aluminum, or coated metal materials, or ceramic or polymeric materials that can be machined or molded into the appropriate shapes.

Figure 1:
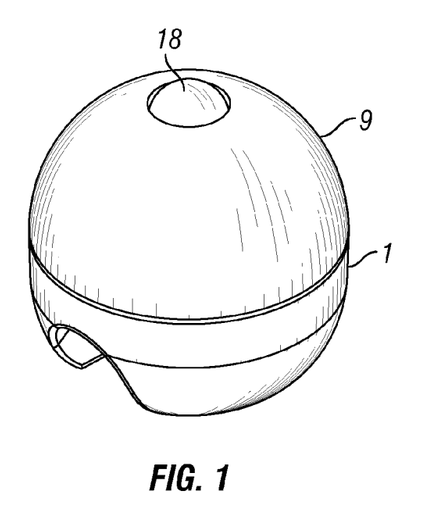
FIG. 1 is a perspective top view of an embodiment of the disclosure.
Figure 2:
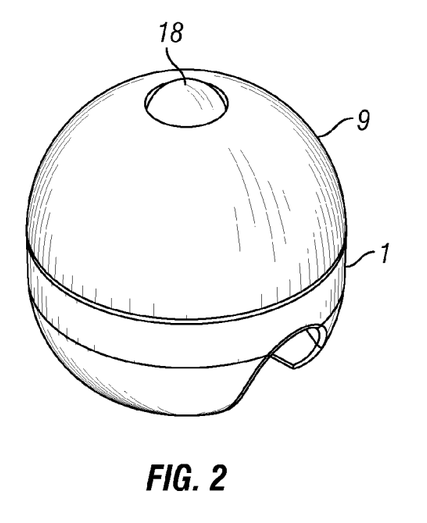
FIG. 2 is a plan view of the top of an embodiment of the disclosure.
Figure 3:
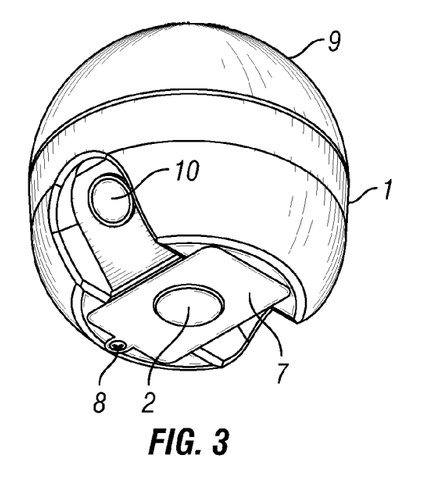
FIG. 3 is a 90° rotated perspective top view of an embodiment as shown in FIG. 1.
Figure 4:
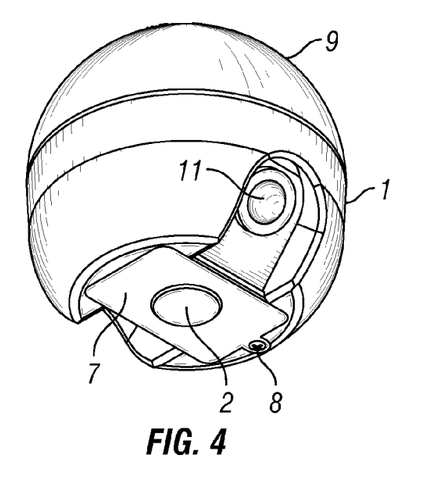
FIG. 4 is a rear plan view of an embodiment of the disclosure.
Figure 5:
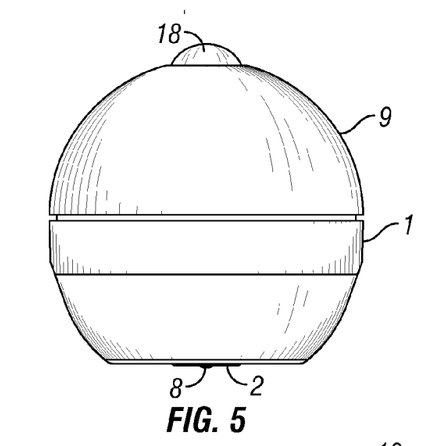
FIG. 5 is a side plan view of an embodiment of the disclosure.
Figure 6:
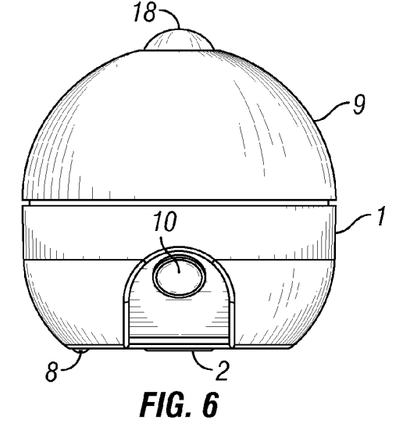
FIG. 6 is a front plan rear view of an embodiment of the disclosure.
Figure 7:
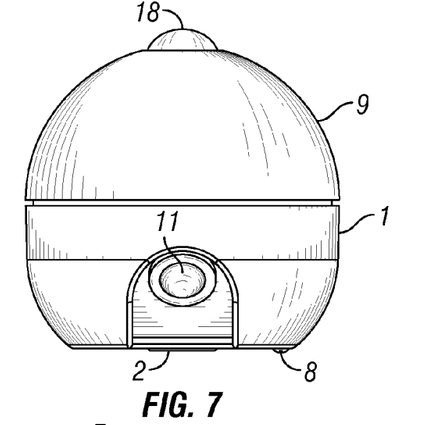
FIG. 7 is a bottom perspective view of an embodiment of the disclosure.
Figure 8:
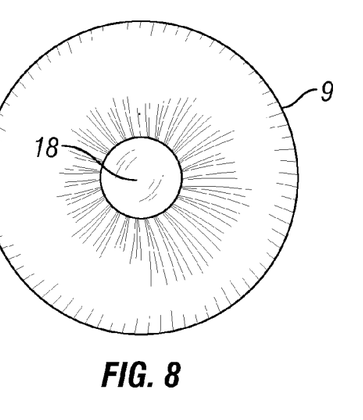
FIG. 8 is a bottom perspective plan view of an embodiment of the disclosure.
Figure 9:
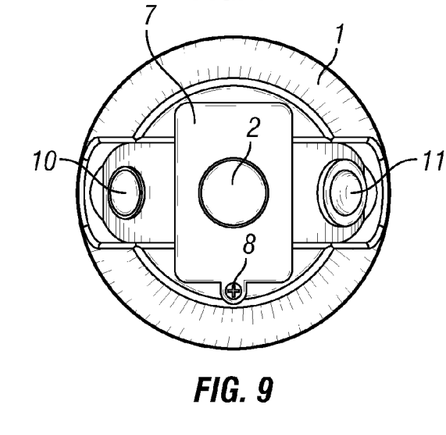
FIG. 9 is a 90° rotated bottom perspective view of an embodiment as shown in FIG. 7.
Figure 10:
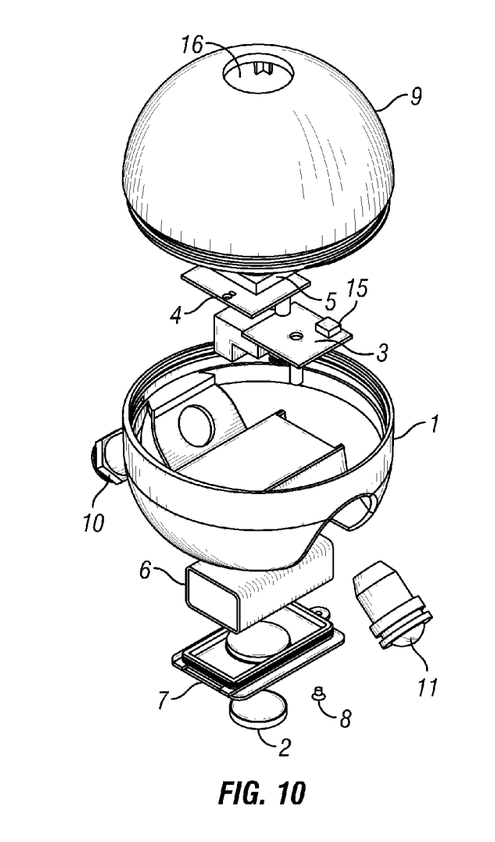
FIG. 10 is an exploded view of an embodiment of the disclosure.

As shown in the exploded view of FIG. 10, the device can be attached or placed on a feeder, such as on the bottom of a feeder and held in place by an attachment means such as a magnet 2, or other fastening means such as screws, rivets, bolts, clamps, a belt or adhesives, for example. It is understood that the device can also be attached to other objects such as trees, poles, etc. or if using a magnet as shown, the device can be magnetically attached to a metal object or plate attached to a feeder or other object. The upper housing provides an opening 16 into the interior of the housing configured to accept and contain the sensor apparatus 18, a part of which projects from the interior of the housing through the opening 16. In certain embodiments the sensor can be adjusted or configured to detect only the presence of large animals to prevent "false alarms," or can be configured to transmit a different or distinguishable signal when triggered by a large vs. a smaller animal, such as a small varmint such as a rabbit, raccoon, coyote or fox vs. a feral hog, for example, or to distinguish a hog from a larger animal such as a deer, cow or horse, for example.

The sensor device in this particular embodiment is mounted on a sensor board 4, and is protected by a sensor cover 5, and is connected to a control board 3, that provides the electronic control circuitry. The circuit board is also connectable to a power source. In the embodiments shown, the power source can be one or more batteries 6, and can be a 9 volt battery as shown or 1, 2, 3, or more AA or AAA batteries. The batteries are contained within the housing and are accessible by a battery door 7 that can be secured with a battery door screw 8 or other devices.

In the embodiment shown in the figures, the lower housing 1 also provides openings for insertion of a power switch 10 and an LED indicator light 11 that can inform a user at a distance that the motion has been detected. As can be seen in FIGS. 4, 7, 9, and 10, the LED indicator light 11 as positioned in the housing 1 is aimed up, or above the horizontal plane so that the light from the LED can be seen from a distance of 50 yards or more, but is shielded from the detection area, or the cone of detection, as illustrated in FIG. 12.

Figure 11:
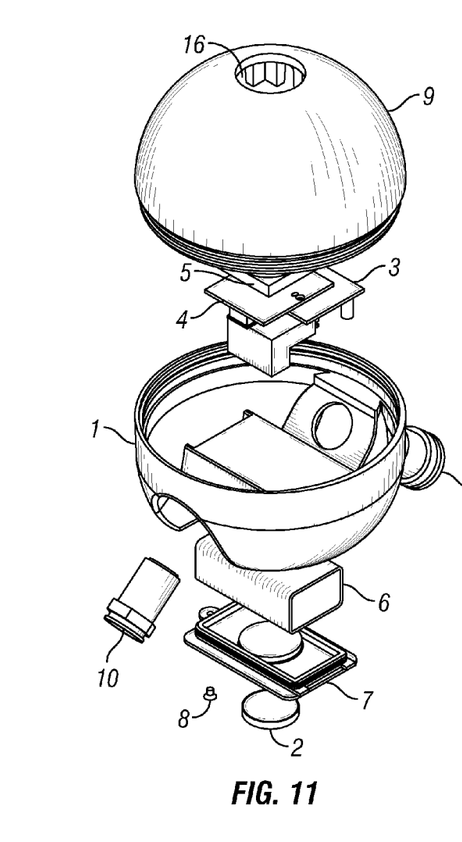
FIG. 11 is rotated view of the exploded view of as in FIG. 10.

As described above, the device can be in wired or wireless communication with a transmitter device to send an alerting signal to a user at a distance of 100 yards, or even 200, 300, 400, or 500 or more yards from the device. The transmitter can send a radio, cellular, or other appropriate signal and can in certain embodiments be equipped with an antenna to receive signals from a user to configure or operate the device. A transmitter or transceiver 15 as described is represented in FIG. 10 as incorporated into the electronic circuit board, but can also be placed elsewhere within the housing or external to the housing. FIG. 11 is a rotated exploded view showing the components as in FIG. 10 except that the optional transmission device is not included.

Figure 12:
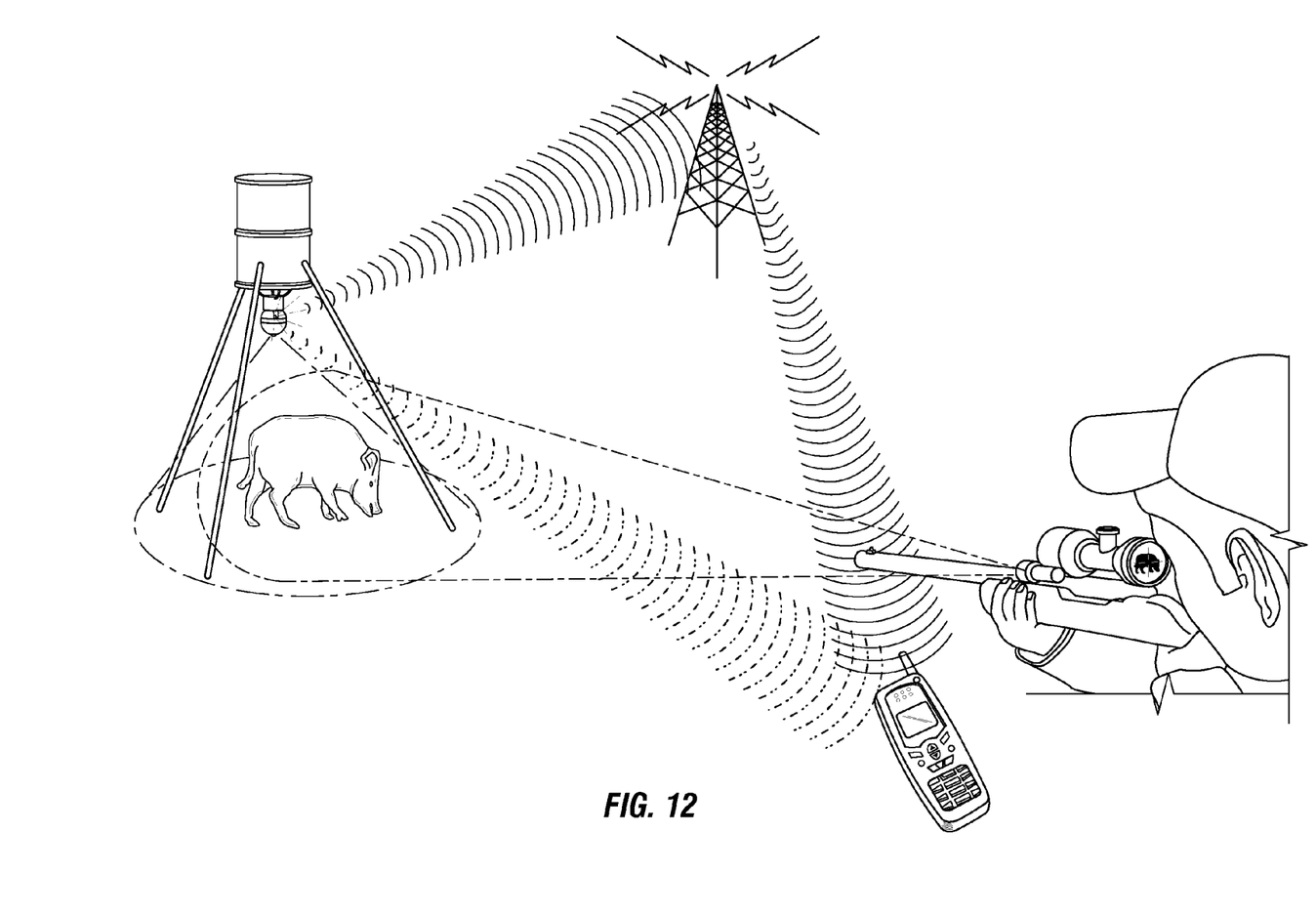
FIG. 12 is an illustration of use of embodiments of the disclosure in which a hunter is notified of the presence of an animal near a remote feeder.
Figure 13:
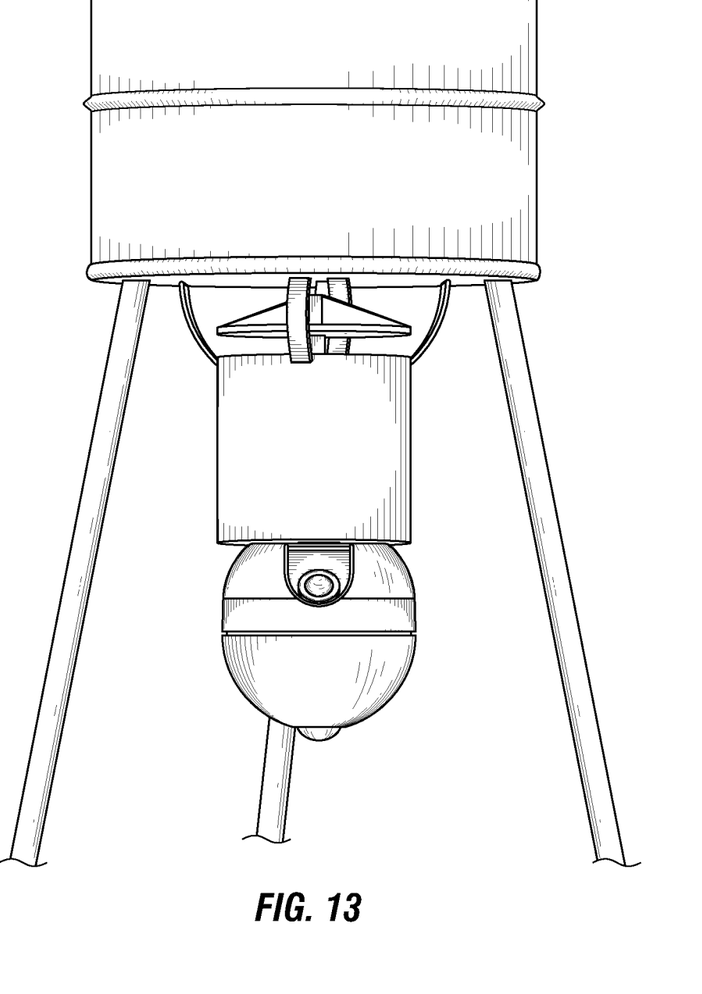
FIG. 13 is an illustration of an embodiment of the disclosure disposed under a game feeder.

FIG. 12 is an illustration of embodiments of the inventions during use. As shown, a hunter or other user can attach a device to the bottom of an automatic or manually controlled game feeder with an integrated magnet or other attachment means, and power the device on. The user can then sit in a remote deer blind or stand in darkness or light from about 50 yards, 100 yards to 500 or more yards distant from the feeder and wait for a signal from the motion detector device to know that game is in the vicinity of the feeder. When receiving such a notification in darkness, the user can activate a scope or rifle mounted light, preferably a laser for a period only long enough to identify the game and take aim. In this way the other animals in the area are less likely to spook and run away from the feeder.

The signal can be transmitted from a radio or cellular transmitter in communication with the sensor device to the user's smartphone, cell phone, pager, tablet or other computer as an audio, visual, vibratory, text signal or any combination thereof to alert the hunter to the presence of motion near the feeder.

In one embodiment, the transmitter on the device can be configured to send a signal to a receiving device, such as a smartphone with an application installed and running thereon, to alert the user to the presence of a certain size of animal. The application can be configured to provide the alert via sound, vibration, a visual cue, and/or other means, and the alert can vary depending on the size of the animal. For example, a signal indicating that a small animal such as a rabbit or squirrel has been detected can be used by the application to display a small rabbit silhouette on the smartphone. A larger animal can result in the display of a hog silhouette, and a still larger animal can result in the display of a deer silhouette.

Figure 14:
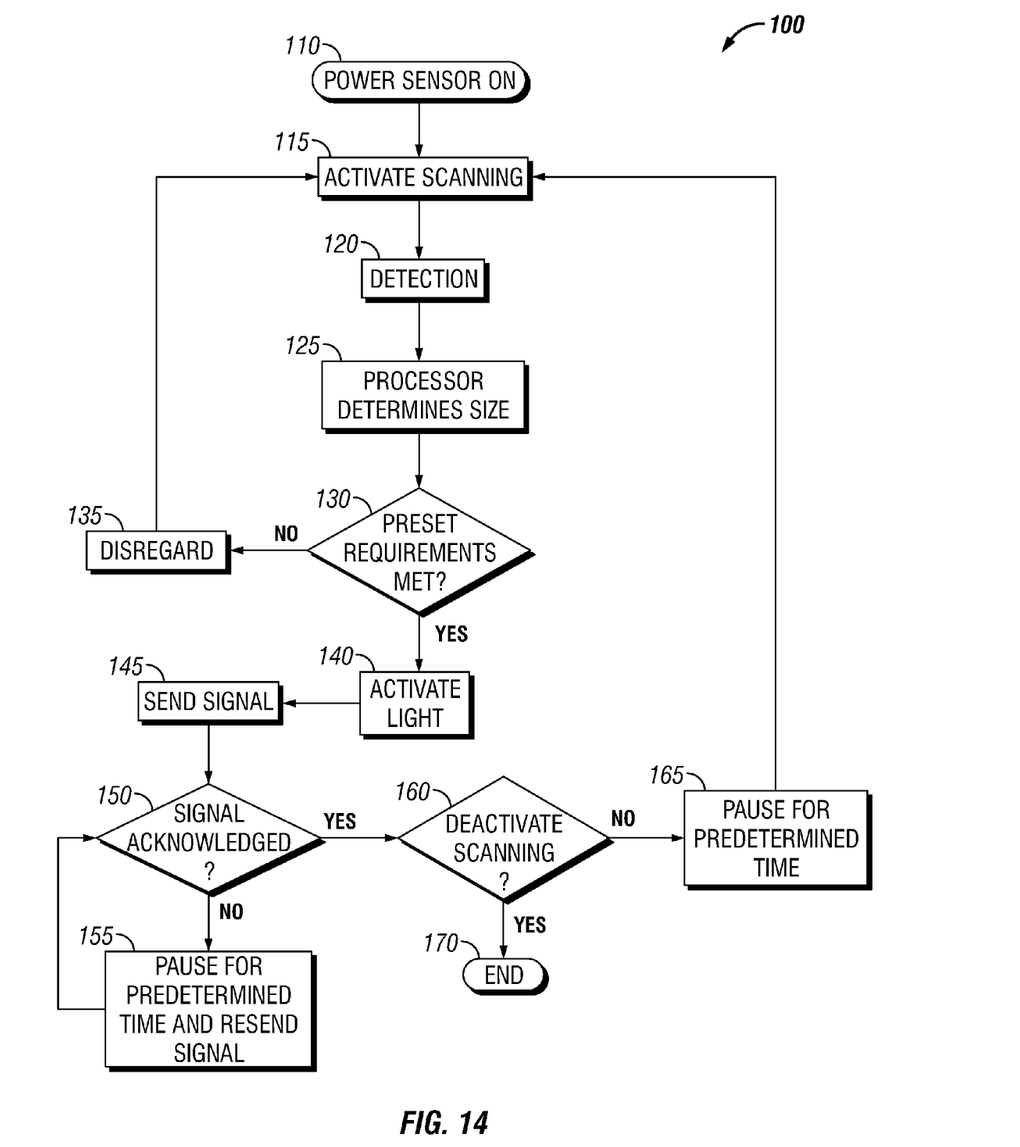
FIG. 14 is a flow diagram illustrating a method of use of the disclosed devices.

An embodiment of use of a device as disclosed is described in FIG. 14. As seen in the figure, a user powers the sensor on 110, which activates scanning 115. Scanning can be continuous or periodic as appropriate to the situation. When the sensor detects the presence of an animal 120, the processor determines the size or category of size of the animal 125 and compares the data to preset requirements 130. If the animal does not meet the preset limits the signal is disregarded 135 and the device resumes scanning 115. If the detected animal falls within the preset limit the device activates the light 140 and optionally causes a transmission device to send a signal 145 to a user. The user can then send a return signal or otherwise acknowledge receipt of the signal 150. If the signal is not acknowledged, the device can pause for a predetermined time and then resend the signal 155. If the signal is acknowledged the device can deactivate scanning 160 for a predetermined period 165, Alternatively the device can be programmed to end 170 until reactivated by a user to return to active scanning 115.

In another embodiment (not shown herein), the LED of the device can be mounted near the top of the device, and can be provided with a swivel mounting. In this embodiment, the device can be located on the ground, on a tree, or in another position, and the LED can be manipulated by a user to point towards a desired location, such as a blind in which the user will be waiting during operation of the device.

In yet another embodiment (not shown herein), one or more cameras can be included in the device, or the device can include connections operable to connect to one or more external cameras. The device can be configured so that the camera takes photographs at regular intervals, which can be set by a user, or can be configured to begin taking photographs when motion is detected, or when a particular type of motion and animal has been detected, such as when a larger animal has been detected. Moreover, the camera can be configured to take video and sound, not just still images. The device and/or the camera can include non-volatile memory and appropriate hardware and software to store the photographs or video images. The camera can be removable from the device or can be permanently attached to the device and, in either event, the device can include appropriate hardware and software to allow a user to download the photographs or video from the device. For example, the device can include an USB port or other standard port to which a user can attach a computer and transfer the images from the camera or other memory of the device. In yet another embodiment, the device can transmit images from the camera to a remote location together with the signal indicating that an animal has been detected, and the image can be displayed and/or stored on the user's smartphone.

In still another embodiment, the device can include appropriate hardware and software to transmit and receive global positioning system (GPS) signals. Such as feature may be useful in order to help track or map animal movements. For example, a plurality of the devices with GPS locators may be set in a variety of locations throughout a ranch, farm, park, or the like. Each device can then store in memory the times, sizes of animals, images of animals, and the like detected and recorded during operation over a given time period, such as overnight. Because each device has a GPS locator, the information gathered by each device can be aggregated and mapped to one or more maps of the ranch, farm, park or the like, and such a map can be animated, which can reveal certain animal movements over the time of operation. The time of operation and information so mapped can include data gathered over hours, days, weeks, months or the like as may be desired, thereby allowing a user to obtain useful information about the location, movement, and habits of various animals.

The devices can be configured to operate in the dark at night, or during the daylight hours relieving the hunter of the need to remain concentrated on the feeder for the entire hunting period.

Although the inventions have been described in terms of specific situations such as night hunting, it is understood that use of the inventions is not limited to the preferred embodiments described herein.

All of the apparatus, components and methods disclosed and claimed herein can be made and used without undue experimentation in light of the present disclosure. While the apparatus, components and methods of this invention have been described in terms of preferred embodiments, it will be apparent to those of skill in the art that variations may be applied to the construction or components described herein without departing from the concept, spirit and scope of the invention. All such similar substitutes and modifications apparent to those skilled in the art are deemed to be within the spirit, scope and concept of the invention as defined by the appended claims.

The invention claimed is:

1. A device for alerting a user at a remote location to the movement of one or more animals of interest in a location near the device, said system comprising:
   a housing;
   an electronic circuit contained in said housing;
   a sensor operable to detect the presence of one or more animals, connected to the electronic circuit and at least partially contained in said housing;
   a connection to the electronic circuit adapted to receive power from a power source;
   a notification device connected to the electronic circuit operable to receive a signal from the sensor and to activate an LED, wherein the LED is attached to the housing, and is aimed above the horizontal plane to be visible at a location at least 50 yards from the device and wherein said LED does not illuminate the location of the one or more animals.

2. The device of claim 1, wherein the sensor is a motion sensor.

3. The device of claim 1, wherein the sensor comprises a night time motion sensor, a passive infrared heat sensor, an ultrasonic sensor a microwave sensor, an acoustic wave sensor or a vibration sensor.

4. The device of claim 1, wherein the device is operable to activate the LED only when one or more animals within a selected range of body profile area are detected.

5. The device of claim 1, wherein the electronic circuit is a microcircuit.

6. The device of claim 1, wherein the connection to the electronic circuit adapted to receive power from a power source is connected to a battery contained in the housing.

7. The device of claim 1, wherein the connection to a power source is a wired connection to an external power source.

8. The device of claim 1, wherein the housing comprises a connection point operable to mount the device on a pole, tree, or game feeder.

9. The device of claim 8, wherein the connection point comprises a magnet with sufficient force to hold the device on the bottom of a metal surface.

10. The device of claim 1, wherein the housing is constructed of metal, ceramic, polymer or a combination of any thereof.

11. The device of claim 10, wherein the housing comprises a weather resistant polymer.

12. The device of claim 11, wherein the housing comprises injection molded acrylonitrile butadiene styrene resin.

13. The device of claim 1, wherein the LED emits a pulse of light of from 1 to 20 seconds duration when activated.

14. The device of claim 1, wherein the LED emits red light visible for at least 500 yards when activated.

15. The device of claim 1, contained in a package for commercial sale with a rifle mountable LED flashlight.

16. The device of claim 15, wherein the LED flashlight emits green light when activated.

17. The device according to claim 1, wherein said housing comprises a spheroid.

18. A system for stealth hunting of feral hogs at night comprising:
   a housing comprising a magnet operable to attach the device to a metal object;
   a motion sensor device operable to detect the presence of one or more animals, wherein said motion sensor device is at least partially contained in said housing;
   a light source electronically connected to the motion sensor device and operable to receive a signal from the motion sensor and to produce light visible at a location remote from the device, wherein said light from said source is attached to the housing and is aimed above the horizontal plane and does not illuminate the ground within the detection zone of the motion detector and said light source is visible at a distance of at least fifty yards from the device; and
   a rifle mountable flashlight effective to illuminate an object at least 100 yards distant from the flashlight.

19. The system of claim 18, wherein the light source connected to the motion sensor is an LED.

20. The system of claim 19, wherein the LED emits a pulse of light of from 1 to 20 seconds duration when activated.

21. The system of claim 19, wherein the LED emits red light visible for at least 500 yards when activated.

22. The system of claim 18, wherein the flashlight is a green LED flashlight.

23. The system of claim 18, wherein the motion sensor is effective to sense motion within a 360° perimeter.

24. The system of claim 18, wherein the motion sensor is configurable to transmit a signal only when the presence of one or more animals within a selected range of body profile area is detected.

25. The system of claim 24, wherein the motion sensor is configurable to transmit a signal only when the presence of one or more animals of at least 3 square feet in body profile area is detected.

26. A system for hunting comprising:
- a spheroidal-shaped housing;
- a motion sensor for detecting the presence of one or more animals at a location, wherein at least a portion of said motion sensor is located within said housing, and wherein said motion sensor is operable to provide a signal indicating the presence of one or more animals, at least one which has a body profile of a preselected size; and
- an LED operable to emit a light in response to a signal indicating the presence of one or more animals, at least one of which has a body profile of a preselected size, wherein the light from said LED is attached to the housing and aimed above the horizontal plane and is visible at one or more locations each of which is at a location at least fifty yards from said housing and does not illuminate the one or more animals.

* * * * *